(12) United States Patent
Karlsson et al.

(10) Patent No.: US 7,215,565 B2
(45) Date of Patent: May 8, 2007

(54) METHOD FOR OPERATING A PASSIVE MATRIX-ADDRESSABLE FERROELECTRIC OR ELECTRET MEMORY DEVICE

(75) Inventors: Christer Karlsson, Linköping (SE); Göran Gustafsson, Linköping (SE); Mats Johansson, Linköping (SE); Per Sandström, Linköping (SE); Per-Erik Nordal, Asker (NO); Hans Gude Gudesen, Brussels (BE); Johan Carlsson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 171 days.

(21) Appl. No.: 11/027,977

(22) Filed: Jan. 4, 2005

(65) Prior Publication Data

US 2006/0146589 A1   Jul. 6, 2006

(51) Int. Cl.
G11C 11/22 (2006.01)
(52) U.S. Cl. .................................. 365/145; 365/222
(58) Field of Classification Search .............. 365/145, 365/222
See application file for complete search history.

(56) References Cited

U.S. PATENT DOCUMENTS

| | | | |
|---|---|---|---|
| 5,550,770 A | 8/1996 | Kuroda | |
| 5,740,100 A | 4/1998 | Yoo | |
| 6,246,602 B1 | 6/2001 | Nishimura | |
| 6,392,919 B1 | 5/2002 | Higgins et al. | |
| 6,807,083 B2 * | 10/2004 | Yamamura | 365/145 |
| 6,937,499 B2 * | 8/2005 | Nordal et al. | 365/145 |
| 6,937,500 B2 * | 8/2005 | Gudesen et al. | 365/145 |

FOREIGN PATENT DOCUMENTS

| | | |
|---|---|---|
| JP | 2000-11665 A | 1/2000 |
| WO | WO 02/05287 A1 | 7/2001 |
| WO | WO-02/05287 A1 | 1/2002 |

* cited by examiner

*Primary Examiner*—Hoai V. Ho
(74) *Attorney, Agent, or Firm*—Birch, Stewart, Kolasch & Birch, LLP

(57) ABSTRACT

In a method for operating a passive matrix-addressable ferroelectric or electret memory device, a voltage pulse protocol based on a 1/3 voltage selection rule is used in order to keep disturb voltages at minimum, the voltage pulse protocol comprising cycles for read and write/erase bases on time sequence of voltage pulses with defined parameters. The method comprises a refresh procedure wherein cells for refresh are selected and refresh requests processed by a memory device controller, the refresh requests are monitored and processed in regard of ongoing or scheduled memory operations, and refresh voltage pulses with defined parameters are applied to the memory cells selected for refresh, while simultaneously ensuring that non-selected memory cells are subjected to zero voltage or voltages which do not affect the polarization state of these cells.

26 Claims, 11 Drawing Sheets a) Virgin, non-imprinted
b) Switched to +Pr, non-imprinted
c) Residing and imprinted in +Pr state
d) Imprinted in +Pr state, switched to -Pr state
e) Residing in -Pr state, +Pr imprint lifted, on way to becoming imprinted in -Pr state
f) Residing and imprinted in -Pr state

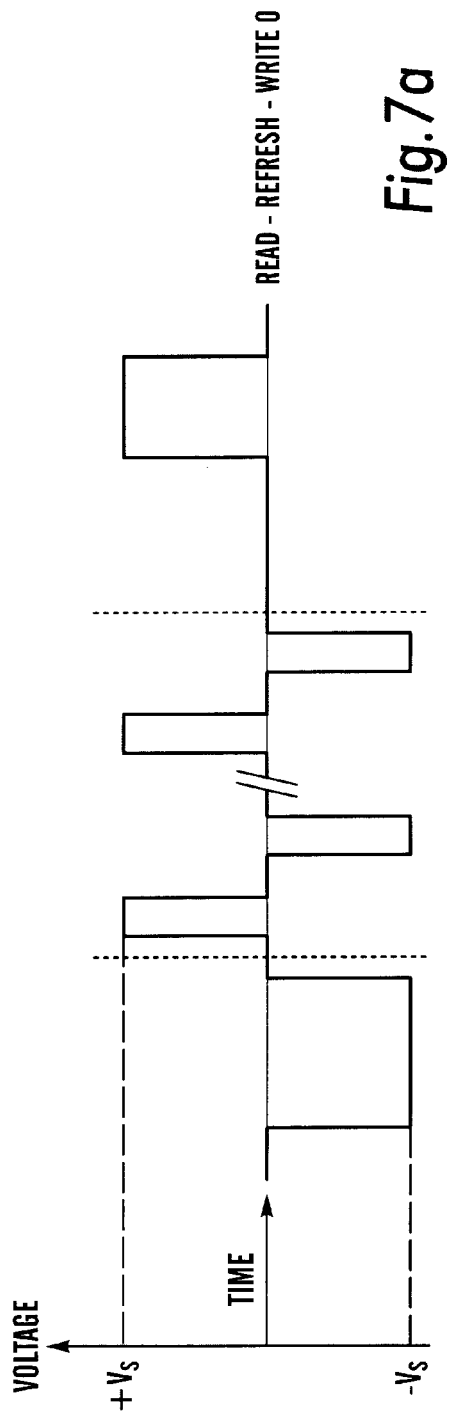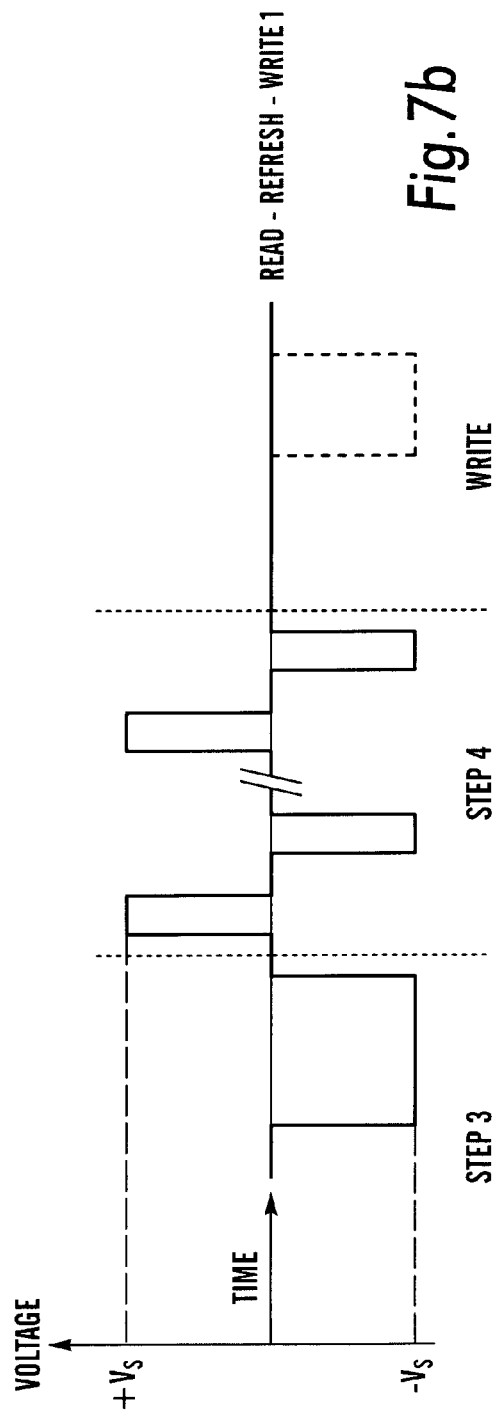

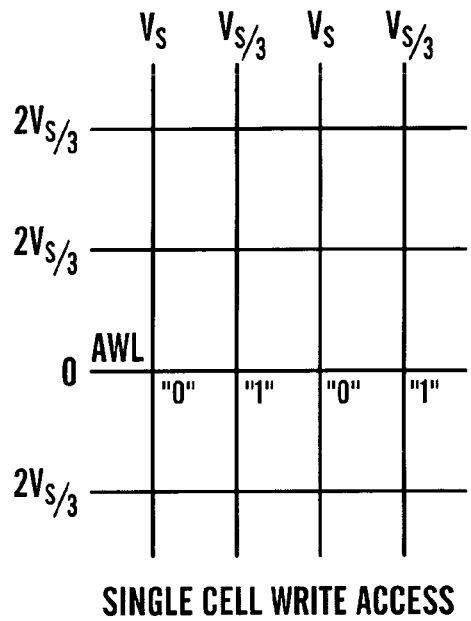
SINGLE CELL WRITE ACCESS
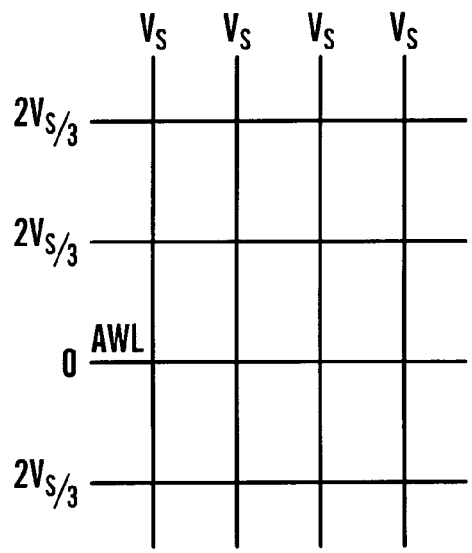 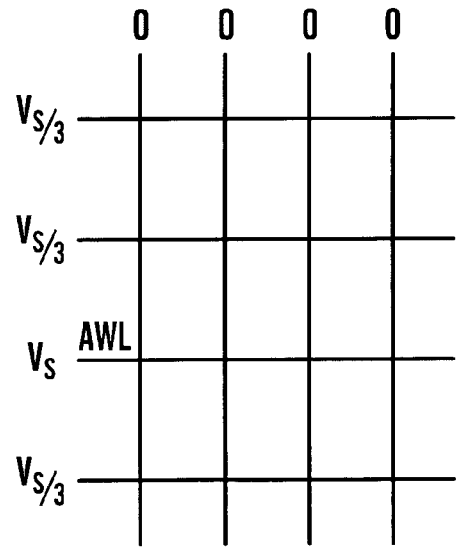
FULL WORD LINE SWITCHING
Fig.9a

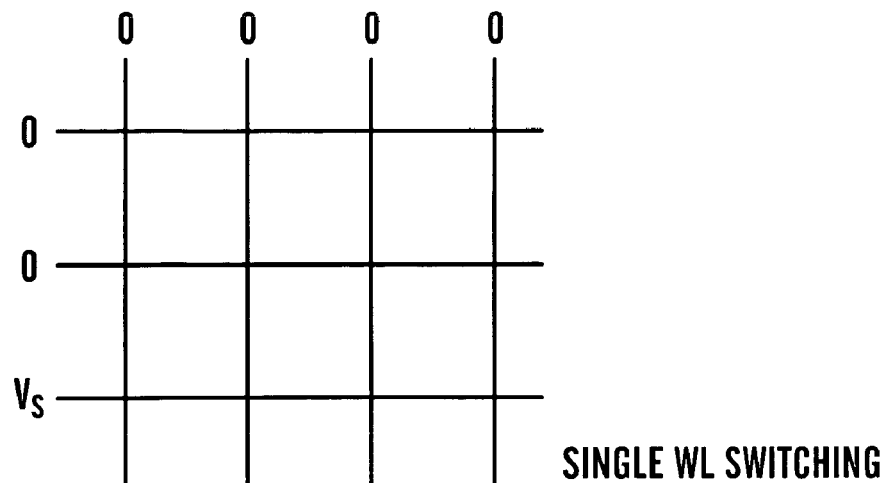
SINGLE WL SWITCHING
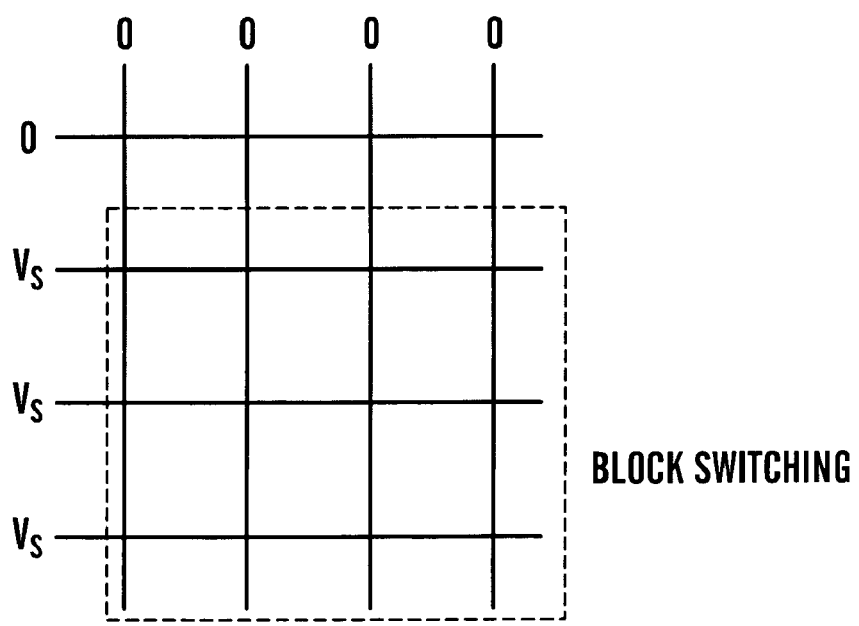
BLOCK SWITCHING
Fig.9b

METHOD FOR OPERATING A PASSIVE MATRIX-ADDRESSABLE FERROELECTRIC OR ELECTRET MEMORY DEVICE

BACKGROUND OF THE INVENTION

The present invention concerns a method for operating a passive-matrix addressable ferroelectric or electret memory device wherein said memory device comprises one or more arrays or matrices with memory cells in the form of a ferroelectric or electret thin-film polarizable material exhibiting hysteresis, particularly a ferroelectric or electret polymer thin film, and a first and second set of respective parallel electrodes, wherein the electrodes of the first set forming word lines (WL) in the device, are provided in substantially orthogonal relationship to the electrodes of the second set forming bit lines (BL) in the device, wherein the electrodes of said first and second set are provided in direct or indirect contact with the thin-film material of the memory cells, whereby a polarization state in individual memory cells can be read, erased or written by applying appropriate voltages to the individual electrodes of respectively said first and second set of electrodes, wherein the method implements a voltage pulse protocol based on a one-third voltage selection rule whereby non-addressed cells are subjected to disturbing voltages across them not exceeding approximately ⅓ of the switching voltage Vs, wherein the voltage pulse protocol comprises a read cycle and a write/erase cycle respectively with time sequences of voltage pulses of predefined amplitudes, polarities and lengths, wherein the read cycle comprises applying a set of voltage differences to electrodes of respectively said first and second set of electrodes in case data are read out from the memory cells, and wherein the write/erase cycle comprises steps for applying another set of voltage differences to electrodes of respectively said first and second set of electrodes.

The relevant device configuration as described above is well known in the prior art, and is generally referred to as a passive matrix-addressed memory. As shown in FIG. 1, it is typically implemented by letting two sets $m_k(k=1 \rightarrow x)$, $n_l(l=1 \rightarrow y)$ of parallel electrodes cross each other, normally in an orthogonal fashion, in order to create a matrix of cross-points that can be individually accessed electrically by selective excitation of the appropriate electrodes from the edge of the matrix. A layer S of a functional (e.g. storage) medium of ferroelectric or electret material is provided between or over the electrode sets such that the capacitor-like structures $2_{kl}$ (functioning as memory cells) are formed in the material between or at the crossings of the electrodes m,n. This is shown in detail in FIG. 2, where a cell $2_{kl}$ is formed in the overlap regions 3 and 4 between electrodes $m_k$ and $n_l$, respectively. Selection of individual cells in the matrix is illustrated in FIG. 3. In conformity with standard usage, each horizontal electrode shall henceforth be termed a Word Line (WL), and each vertical electrode a Bit Line (BL). Furthermore, the electrodes employed in the electrical selection of a single cell or a set of cells in the matrix shall be termed an Active Word Line (AWL) and an Active Bit Line (ABL). When applying potential differences between an AWL and an ABL, the ferroelectric or electret material in the selected cell is subjected to an electric field which generates a polarization response generally tracing a hysteresis curve or a portion thereof, (cf. below). By manipulating the direction and the magnitude of the electric field, the memory cell can be left in a desired polarization state corresponding to a certain logic value. The passive addressing of this type of arrangement leads to simplicity of manufacture and a high density of cross-points.

The use of ferroelectrics or electrets as memory materials confers non-volatility upon the memory devices in question, due to their ability to retain a logic state in the absence of applied voltages or currents to the memory device. This attribute of ferroelectrics in particular is known and attempts have been made to exploit it in prior art memory devices. It is based on the fact that these electrically polarizable materials possess at least two equilibrium orientations of the spontaneous polarization vector in the absence of an external electrical field. The spontaneous polarization vector may be switched between these two orientations by an electric field. One of the polarization states is considered to be a logic "1" and the other state a logic "0". Referring to FIG. 4, a material with a hysteresis loop as shown changes its polarization direction upon application of an electric field that exceeds the coercive field $E_C$ (the hysteresis loop is shown with the voltage across the cell rather than the field along the abscissa axis for reasons of convenience). A saturation polarization $P_S$ is obtained whenever a memory cell is subjected to the nominal switching voltage $V_S$. As the applied voltage is reduced to zero, the polarization will follow the hysteresis curve and end up at the remanence value $P_R$. Depending on the polarity of the applied voltage, this zero field point may be at either the polarization state marked "1" or "0" in the figure, representing the two accessible logic states of the cell.

It should be noted that the shape of the hysteresis curve may depend on the speed at which the ferroelectric or electret material is cycled through the curve, as well as on the properties of the electrodes used to create the ferroelectric cell, and other factors (e.g. temperature). In particular, whereas many materials exhibit a hysteresis curve like the one in FIG. 4 when cycled at low speed, the apparent coercive field may increase and the apparent remanent polarization may become less as the voltage slew rate increases. Conversely, at very low slew rates the apparent coercive field may be strongly reduced or approach zero, especially in pure electrets with no ferroelectric contribution to the polarization. Furthermore, the presence or appearance of low-dielectric constant layers on the electrodes (e.g. due to chemical reactions at the electrode interface contacting the electret or ferroelectric material) shall increase the apparent coercive field. This implies that the terms "Coercive field" or "Coercive voltage" and "Remanent polarization" when employed in the following shall be understood to represent the corresponding quantitites in FIG. 4, as they appear under the specific operative conditions prevailing during applications of the teachings of the present document.

There are certain problems related to the polarizable materials that must be dealt with in order to make commercially viable devices, namely fatigue, imprint and disturb:

Fatigue results from repeated switching of the polarization direction in a given memory cell, whereby the switchable polarization progressively diminishes and ultimately becomes too small to allow proper operation of the memory. This phenomenon is well known and a range of remedies exist in the prior art. The present remedies are, however, generally material-specific and inadequate to provide fatigue resistance in commercially viable devices.

Imprint affects memory cells that are allowed to remain in a given logic state for a period of time. It manifests itself as a change in the switching properties whereby the hysteresis curve shifts so as to increase the coercive field perceived when switching the polarization direction to that opposite to the one where the material has resided during the imprinting period. In other words, the polarization has a tendency to become stuck in the direction where it is allowed to rest for some time.

Disturb is related to loss of polarization in a ferroelectric or electret memory cell which has been prepared in a given polarization state, when the cell is exposed to disturbing voltage pulses with a polarity in the opposite direction (i.e. a direction tending to polarize the cell in a sense opposite to that where it had been prepared). Even when the disturbing voltages are well below those corresponding to the coercive field, repeated exposure may cause the memory material to undergo partial switching leading to a loss of polarization. The extent of the partial switching depends on the material properties but may ultimately degrade the remanent polarization states $P_r$ and $-P_r$ to the extent that erroneous read results result.

Of the three problem areas mentioned above, fatigue and imprint are relevant in all types of ferroelectric or electret memory architectures, i.e. both in devices employing one or more transistors per memory cell (termed active matrix devices below) and in passive matrix devices as referred above. Remedies taught in prior art include strategies for postponing or reducing the onset of fatigue and imprint, as well as methods and apparatus for restoring the memory material in the fatigued and imprinted cells to a pristine or less-affected state. The latter procedures are generally collectively referred to as "refresh".

Before proceeding, it should be emphasized that the present invention concerns a different type of refresh from that which is employed in prior art volatile memories such as different types of DRAMs, where memory cells typically are refreshed every 64 msec. This type of "traditional" memory refresh is performed to compensate for loss of stored charge in capacitors typically containing linear high-epsilon dielectrics, thus ensuring that the stored logic value in each memory cell is maintained. Typically, the whole memory is not refreshed at once since this cause a big surge in power and stall in data requests. To solve this, the refresh is split into one row/block of memory at each time resulting in a refresh period of e.g. 64 msec/number of rows.

In ferroelectric memories of the active matrix type, as opposed to the passive ones, problems like fatigue and imprint dominate and there is a need for refresh, both to retain the volatile polarization at a proper level but also to restore properties of the ferroelectric memory material.

In U.S. Pat. No. 5,550,770 (Kuroda), the memory device consists of arrays of ferroelectric memory cells, exemplified exclusively as containing ceramic ferroelectrics such as BaTiO or PZT, in active-matrix block addressing configurations of the 1T-NC type. In order to permit a simple Vs/2 selection scheme, N is a low number, e.g. N=8. Since it is the write operations that are considered to cause the need of refresh, there is a counter per memory block which is used to memorize the number of completed write operations before a forced refresh is carried out. This is carried out by first performing a destructive read of all cells of the memory block and temporarily storing the data elsewhere. Then all cells of the memory block are exposed to a voltage higher than the write voltage to achieve refresh by re-poling. Finally, the temporarily stored data are written back such that the polarization is switched only for those cells that are not already in the desired polarization state at that time. Beyond the specification that the refresh voltage shall be higher than that used in the standard read/write accesses, Kuroda provides no examples of, or teachings on the appropriate selection of refresh voltage pulse parameters, e.g. pulse shape, duration, degree of overvoltage, polarity shifts, if any, number or waiting periods.

In U.S. Pat. No. 5,777,921(Takata & al.) a device is disclosed with double counters for each memory block or memory cell, one for writing/reading one type of logic data and another for reading/writing the other type of logic data wherein refresh is initiated when either of the counters reach a predetermined value. Depending on which counter initiating the refresh the refresh voltages applied will look different such that the ferroelectric material will undergo a complete hysteresis cycle which is asserted to be a known method to restore the deterioration of the spontaneous electric field, i.e. to remove the imprinting effect. Since attention is paid to data content the refresh can be more efficient in terms of time for one type of logical data and there is no need to temporarily store data elsewhere during refresh. In the case of memory-cell based refresh, or small memory block, the redundancy of allocating cells for unnecessary refresh may be avoided but to the price of more counters.

In EP patent No. 0495572 (Moazzami & al.) a "higher than normal" voltage is used to exercise "the ferroelectric components" periodically to "refresh, or re-establish, the polarization state" and the refresh is further initiated after a predefined number of memory access cycles and/or after a predefined period of time.

In the found prior art no specific attention is paid to the problem of imprint at power up, i.e. after the memory has not been actively used for a period of time. Since such a period may be arbitrarily long there is a risk for substantial imprint, and in cases where the duration of the inactive period is not known a situation of maximum imprint has to be assumed and consequently dealt with.

In ferroelectric memories of the passive matrix type the absence of active elements in each cell facilitates higher integration density, lower power consumption and less complexity than in active matrix based counterparts. However, the problems of fatigue and imprint must be handled, as must the additional detrimental phenomenon of "disturb" referred above: Passive matrix memories lack active elements such as transistors that can connect/disconnect each memory cell from the rest of the matrix network during write/read/erase operations, and in certain operations involving single cell access it is inevitable that non-addressed memory cells are subjected to disturbing voltages. The magnitudes of such disturbing voltages on non-addressed cells depend on the timing and magnitudes of voltages applied to word- and bit-lines connecting to addressed as well as non-addressed cells in the matrix, and prior art literature contains teachings on how to avoid or reduce such complications by the use of voltage pulse protocols, i.e. precisely defined time- and amplitude-relationships between electrical potentials on all bit- and word-lines during operation of passive matrix addressed memory arrays. Examples of pulse protocols containing coordinated sequences of operations, e.g. imposing various sets of voltage pulses, connecting to sense amplifiers, grounding etc. can be found in U.S. Pat. No. 3,002,182 (Andersson), U.S. Pat. No. 4,169,258 (Tannas Jr.) and the published International Patent Application No. WO 02/05287 (Thompson et al.).

Unfortunately, even the most cleverly designed pulse protocols are subject to fundamental limitations, and the basic problem of disturb cannot in general be obviated by this means alone: As shown in the above quoted WO 02/05287, read- or write-related random access to single cells with a voltage Vs shall always imply subjecting non-addressed cells to disturbing voltages comparable to or larger than approximately Vs/3. In the following, protocols that expose non-addressed cells to a maximum disturb voltage of Vs/2 or Vs/3 shall be termed Vs/2 and Vs/3 protocols, respectively. Although Vs/3 is typically well below the voltage required to exceed the coercive field in the memory material in the cells, repeated exposure may lead to gradual loss of polarization and corresponding loss of information content. The disturb problem becomes particularly acute in advanced memory devices where it is sought to gain maximum advantage of the passive matrix addressing concept by using large matrices with typically thousands of crossing word lines and bit lines. This may cause non-addressed cells in the matrix to experience very large numbers of disturbing voltage pulses between each time they are accessed for write, read or erase operations. The net result of this may be that certain cells suffer a loss of polarization to an extent where the magnitude of the polarization switching during a read operation falls below the discrimination threshold between logic "0" and logic "1".

One possibility for minimizing disturb in large passive matrix based memories is to divide each large matrix physically or electrically into a number of segments, wherein each such segment or "sub-matrix" can be seen as a passive matrix of its own. A suitable definition of a passive sub-matrix is that a memory cell being addressed in a certain sub-matrix, e.g. through a read or write operation, shall only give rise to disturb voltages on other memory cells in that same sub-matrix and not in other sub-matrices in the memory. Segmentation has been described to a limited extent in the prior art, with primary focus on reducing the effects of parasitic capacitances and sneak/relaxation currents which slow down and corrupt the electrical response of large passive matrix structures. Examples of segmentation/division are disclosed in the present applicant's pending patent application 20035225.

Exacerbating the problem of disturb in passive matrix addressed devices is the fact that imprint may start developing on very short timescales after the cell has been left in a polarized state, e.g. during a single pulse sequence under a protocol for normal write/read/erase operations. Thus, memory cells that have recently experienced an operation involving polarization reversal at one point in a voltage pulse protocol may retain significant imprint in the pre-reversal direction at a later stage in the same voltage pulse protocol, and consequently be extra prone to disturb. Since both imprint and disturb are typically affected by fatigue, it becomes apparent that successful strategies to handle these phenomena must take into account the strong interrelationships between all of them.

SUMMARY OF THE INVENTION

In view of the above considerations, it is a major object of the present invention to provide basic strategies for avoiding, reducing or reversing the deleterious effects of imprint and disturb in memory, display or processing devices based on electrets or ferroelectrics in passive matrix addressed configurations.

It is a further major object of the present invention to describe specific methods and procedures for extracting data from memory cells with electret or ferroelectric material that is heavily imprinted.

It is a further major object of the present invention to describe specific methods and procedures for conditioning or restoring the electret or ferroelectric material after it has developed imprint.

It is a further major object of the present invention to describe specific methods and procedures for refreshing or restoring the polarization state of the electret or ferroelectric in cells that have been subjected to disturb.

It is a further major object of the present invention to describe apparatus to implement the above referred strategies, methods and procedures.

The above objects are realized according to the present invention by providing methods and structures that enable manipulating the polarization in the electret or ferroelectric in individual cells according to certain electric drive protocols, the latter taking into consideration the history of electrical and environmental influences on the same cells and the operative requirements of the device in which the cells are located.

The methods are characterized by comprising a refresh procedure with the following steps, a) a first step for selecting according to criteria programmed in a memory device controller, one or more cells for refresh and entering the address of the one or more cells thus selected, in a refresh request processed in the controller, b) a second step for monitoring and processing the refresh requests, taking into account ongoing or scheduled memory operations and the priorities assigned thereto, and initiating the refresh procedure, c) a third step for applying simultaneously to the one or more cells selected for refresh a voltage pulse of a defined polarity and a magnitude corresponding to the coercive voltage or higher, while all non-selected memory cells are subjected to zero voltage or a voltage significantly less than the coercive voltage, and d) a fourth step for applying simultaneously to all selected cells a single voltage pulse or a train of voltage pulses, at least one of the voltage pulses having a polarity opposite the defined polarity in step c) and with a magnitude corresponding to the coercive voltage or higher, while all non-selected cells are subjected to zero voltage or a voltage significantly less than the coercive voltage.

Further features and advantages of the present invention shall be apparent from the appended dependent claims.

BRIEF DESCRIPTION OF THE DRAWINGS

The present invention shall be better understood from the following discussion of its general background and various preferred embodiments with reference to the drawing figures of which

Before the invention is described in greater detail, the general background of the invention concepts shall briefly be discussed.

DESCRIPTION OF THE INVENTION

The imprint phenomenon appears to be universally present in all ferroelectric materials hitherto tried in ferroelectric-based memory devices, both where the materials are inorganic (ceramic) and organic (polymeric). The severity of the imprinting does, however, vary within wide bounds and can be affected by modification of materials and processing. Typically, imprint develops rapidly (sub-milliseconds to seconds) when the material is polarized in a given direction, and then gradually develops more slowly, in some cases following a logarithmic time dependence up to very long times (hours to years), in other cases appearing to flatten out to a fixed level at long times. Models to explain the imprint phenomenon include charge migration in the ferroelectric and its boundary surfaces in response to internal fields in the ferroelectric cell. A detailed understanding of the underlying mechanisms is not required, however, in order to provide remedies as described in the present invention, and this theme shall not be pursued further here. A basic premise for the present invention is that imprint can be mitigated by judicious application of electric field stresses in the electret or ferroelectric material in the memory cells. This is based on extensive empirical data that have been accumulated for a range of relevant materials.

Figure 5:
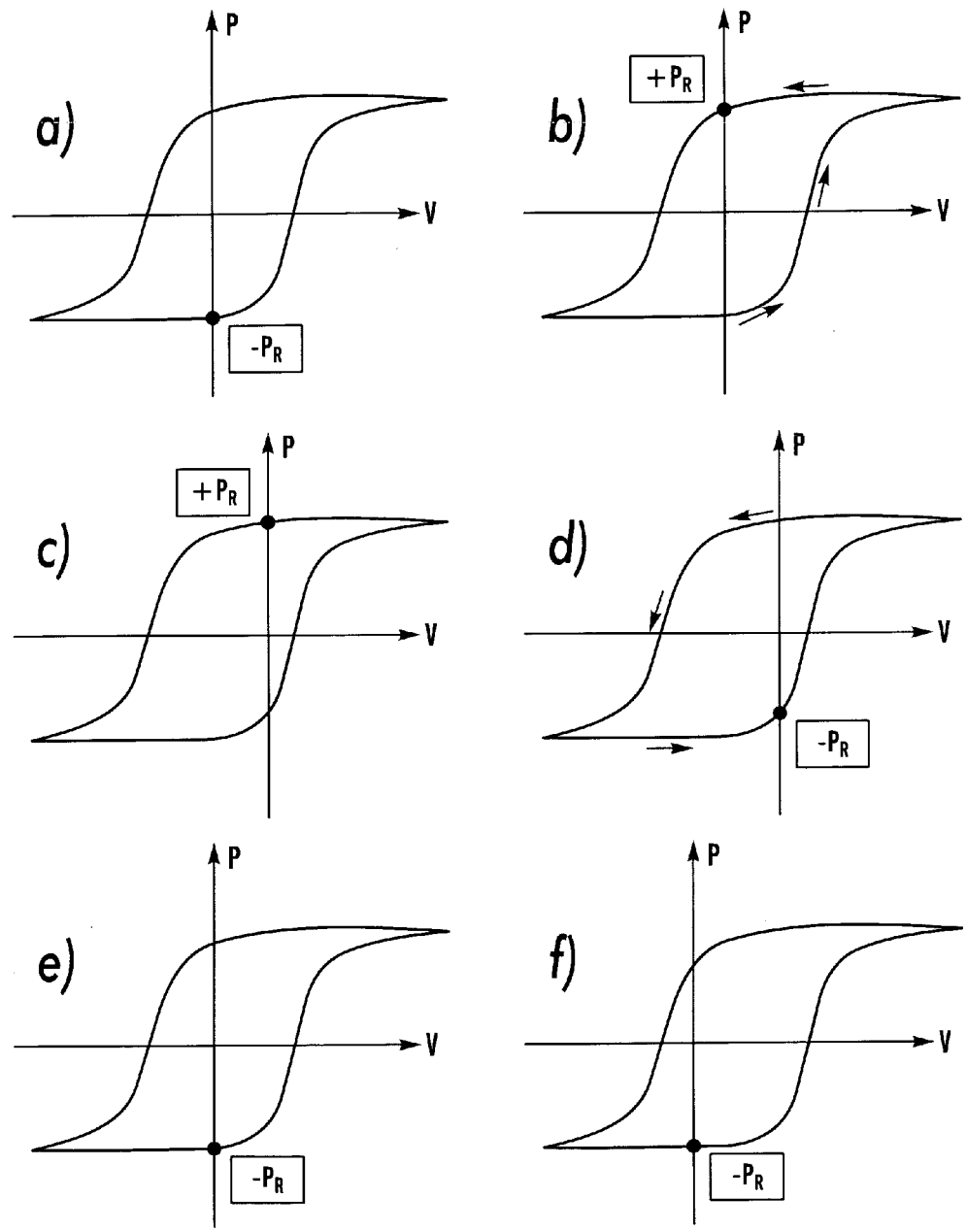

Referring to FIGS. 5a–f, the shift in the hysteresis curve is associated with the memory material being polarized in the +$P_r$ or −$P_r$ state. Assume that the cell is initially in a non-imprinted state with a remanent polarization −$P_r$ as shown in FIG. 5a. How this is achieved, is not essential for the further discussion. At some given time it is switched into the +$P_r$ state as shown in FIG. 5b and allowed to remain in that state. The imprinting process shall then gradually shift the hysteresis curve towards the left, ultimately ending up shifted as shown in FIG. 5c. At this point one may note that imprinting tends to lock the polarization in the imprinted state: Applying a voltage in the + polarity direction shall only lead to excursions along the saturated top part of the hysteresis curve (i.e. that part of the curve where non-switching dielectric response dominates), with polarization returning to the +$P_r$ state when the voltage is removed. Application of a voltage in the − polarity direction shall not cause any appreciable switching out of the +$P_r$ state until the voltage is of a magnitude well exceeding the non-imprinted coercive voltage −Vc indicated in FIG. 5c. If a sufficiently high switching voltage of − polarity is applied, and then returned to zero, the cell shall switch and end up in the −$P_r$ state as shown in FIG. 5d. If this occurs on a time scale short compared to the imprinting process, the cell shall initially respond to applied voltages according to the hysteresis curve shown in FIG. 5d. As time progresses, the hysteresis curve will gradually shift to the right, evolving through a transient, quasi non-imprinted state as shown in FIG. 5e and ultimately ending up in a new imprinted state reflecting the −$P_r$ polarization as shown in FIG. 5f. In practice, the speed and end status of this process depends on the magnitude and duration of the switching pulse, as well as numerous other factors that include materials and processes employed for making the cell structure. It has been observed in many cases that imprint and disturb properties are affected by the switching history (fatigue) of the cell in question, and by environmental parameters such as humidity and temperature.

An important consequence of the above is that a cell in one of the two remanence states +$P_r$ or −$P_r$ shall always be imprinted in one direction or the other if allowed to reside in one of these states for a sufficiently long time. Thus, in memory devices being operated under normal write/read/erase protocols where polarization is always present in the cells and may experience reversal of direction but not reduction to zero, a non-imprinted state is only encountered as part of a dynamic situation in conjunction with pulses causing partial or complete switching of polarization. As a consequence, procedures that render a cell non-imprinted can only be useful in cases where operations are taking place on a time scale shorter than that typical for the development of imprint. (An example of a procedure for preparing the cell temporarily in an essentially non-imprinted state regardless of the original direction of imprint is to apply a series of pulses that are strong enough to lift the cell out of its initially imprinted state and which switch the polarization back and forth so fast that imprint does not have time to develop in either direction). On the other hand, there is less to be gained by refreshing procedures that remove imprint from cells when the object is to perform operations on those cells at an unspecified later time.

Returning to FIGS. 5a–f, it is simple to see that imprint and disturb are intimately linked: If a cell is prepared in a given polarization state and allowed to imprint as shown in FIG. 5c for the +$P_r$ state, it effectively becomes locked in that state and can withstand significant disturb voltage stress without losing its polarization. On the other hand, if the cell has recently been switched from an imprinted state and left in a state of the opposite polarization. The effective coercive field against switching back into the imprinted state is much less than −$V_c$. This can be seen clearly in FIG. 5d, where the application of a modest voltage in the + direction shall cause transition to the +$P_r$ state. Thus, significant back-switching with resulting loss of remanent polarization can take place even when operating under a writing protocol that limits the disturbing voltage to Vs/3, unless the cell is allowed to remain unperturbed in the new state long enough for imprint to stabilize the new state (cf. FIGS. 5e, 5f).

In accordance with the above, the present invention is based on the precept that the dynamic nature of the imprinting process makes it is possible to effect refresh or restore operations on the memory cells by judicious selection of pulse sequences, the refresh being effective within time-frames permitting reading and writing operations.

The stated objectives are achieved by imposing a multi-step refresh procedure, the basic elements of which are as follows:

In a first step, the cells that are to be subjected to refresh are selected. This is done according to criteria programmed into a controller in the memory device, and the selected cells may encompass from a single memory cell or word line and up to and including the entire memory device. Following the selection, a refresh request status is set within the controller.

In a second step, the request for refresh is processed, taking into account ongoing or scheduled memory operations and the priorities assigned thereto, and the refresh voltage pulse sequences are initiated.

In a third step, the initiating pulse in the refresh sequence is applied to the selected cells. Since this pulse destroys any data that were stored before application of the pulse, instructions for temporarily saving (in the case of e.g. refresh with write-back) or transmitting the data (in the case of read-out) must be provided.

In a fourth step, the rest of the voltage pulses in the refresh sequence are applied.

Optionally, in a subsequent writing step where temporarily saved or new data are to be written into the refreshed cells, a writing pulse sequence is applied, employing either a full word or single cell writing protocol. This step must be performed while the beneficial effects of the refresh are still present.

The first step in the refresh procedure shall now be discussed. As is apparent from the background descriptions above, selection of cells to be refreshed must take into account processes that evolve concurrently and interdependent on each other and on external parameters as well. Thus, there is the progressive development of imprint which locks polarization in place, leading to a slower and diminished switching response during destructive read-out. This is primarily a time integration effect, essentially independent of disturb voltage stresses, but potentially dependent on the temperature and fatigue state of the cells in question. Adding the effects of disturb to those of imprint, the dynamic development of imprint becomes important on short as well as long time scales. Finally, a large number of repeated disturbs can lead to gradual erosion of polarization even in heavily imprint-stabilized cells. In a situation with large number of disturbs and given a certain pulse protocol for operating the memory device, e.g. incorporating a Vs/3 write protocol, a decision on when to perform a refresh operation shall typically be governed by the number of disturb events.

According to the present invention, three types of decision modes may be invoked for selecting the cells that are to be refreshed. These shall be described under the categories:
Default mode
Predictive mode
Feedback mode i) Default Mode: Preferred Embodiments In this mode, refresh/restore operations according to the present invention are implemented automatically, i.e. not dependent on any estimated or perceived level of imprint and disturb in the cells being refreshed.

According to one preferred embodiment of the present invention this shall be whenever a command is received for reading or writing data, following a period when the matrix or the memory device of which it is a part has been in a dormant or switched off state. As an example of this, implementation of the refresh procedure is performed automatically in conjunction with the first read or write operation that takes place after boot-up, independent of the usage history of the matrix prior to the boot-up event.

According to another preferred embodiment involving the default mode, refresh/restore operations are initiated at certain time marks as determined by an internal or external clock showing absolute time or accumulated system running time. Examples may be once every hour or every day/week/month.

In one sub-category of these preferred embodiments, the refresh procedure is applied on only the word line or word lines that are addressed for read or write access.

In another sub-category of these preferred embodiments, a complete matrix or part of same is refreshed by running through the refresh procedure with a write-back step included, word line by word line in a stepped sequence. The data content on each word line is temporarily stored elsewhere in the memory device.

In yet another sub-category of these preferred embodiments, a complete matrix or part of same is refreshed by running through the refresh procedure with a write-back step included, writing blocks containing two or more word lines word lines in parallel. The data content on each word line is temporarily stored elsewhere in the memory device.

ii) Predictive Mode: Preferred Embodiments.

In this mode, imprint and disturb are assumed to develop in a predictable manner in relationship to metrics that can be defined and determined numerically from the usage history of the matrix.

Preferred embodiments involving such metrics are based upon:

The elapsed time since a refresh procedure involving a write step has been performed on a given cell or group of cells in the matrix. Here, elapsed time may be defined to include or not include periods where the memory device has been switched off, etc.

The number of write disturb events suffered by a given cell or group of cells since that cell or group of cells was written or refreshed (re-written).

A metric based on combined input data, e.g. accumulated disturb stress determined by adding disturb events at a given cell or group of cells weighted by the time since that cell or group of cells was last being written/refreshed. An important class of metrics of the combined type is one where environmental parameters, in particular the temperature, are employed as input variables: Empirically it has been observed that the temporal development of imprint may depend significantly on the temperature in the electret or ferroelectric, typically speeding up at higher temperatures.

In the predictive mode, refresh/restore procedures are typically implemented less frequently than in the default mode, leading to less demand on system resources.

iii) Feedback Mode. Preferred Embodiments.

This implies ascertaining the real state of affairs in a given cell or group of cells by measuring relevant cell response parameters, e.g. the polarization switching response (speed and magnitude) to a standardized pulse protocol. The latter may incorporate pulses of varying amplitude, separated by time delays.

In one class of preferred embodiments, measurements are performed on the cell or group of cells that are targeted for write/read operations during the regular operation of the memory device. This is possible by inserting a diagnostic feature into the detection of the switched charge during the third step of the refresh procedure in connection with otherwise scheduled read-out or refresh. Since this adds time and complication to the ordinary pulse protocol, it needs not be performed at all times, but can be implemented when the memory device controller so decides, e.g. in response to counting of access events as described under ii) Predictive Mode above.

In a related preferred embodiment, the first three steps in the refresh procedure are combined such that step three, when executed in response to a read command, includes a diagnostic feature such as switching speed measurement. Contingent on steps one and two flagging a need for refresh condition, the following steps in the refresh procedure shall follow.

In yet another preferred embodiment, another cell or group of cells with similar operational history are used to serve as a reference. To ensure that the operational history really is similar, the selected reference cell or cells may be located on the same word line or group of word lines as the cell or cells being monitored for potential refresh, whereby the number of switching accesses and hence disturb effect shall be reduced.

In yet another preferred embodiment, the control unit in the memory device keeps track of the operational history of relevant memory cells or groups of memory cells, e.g. in the form of a sub-matrix as previously described, and performs measurements on reference cells that have purposely been subjected to the same operational history through a "shadow" or "slave" existence in a part of the matrix allocated for that purpose.

The second step in the refresh procedure shall now be discussed: Refresh and write-back procedures take time to perform and require a range of resources in the memory device. This implies that special care must be taken to minimize conflicts with the regular operations of the memory device, e.g. with regards to temporal access priorities to the matrix and ancillary hardware. Furthermore, the capability of implementing corrective measures according to the present invention has consequences for the physical complexity and cost of the memory device. Accordingly, the decision modes described above shall typically be part of a priority hierarchy adapted to the technical capabilities and expected usage profile of the device in question. Towards this end, one or both of the following strategies may be followed:

Performing as few refresh/restore operations as possible while conforming with the minimum requirements for stored data integrity and error rate in read-out. In this connection one notes that the decision modes i), ii), iii) above may be configured to allow progressively less intrusion into the normal operations of the memory device.

Making use of idle time when no write/erase/read commands involving the matrix or sub-matrix in question are being executed.

Decisions relating to the priority hierarchy are made by a controller unit which keeps track of incoming commands, ongoing operations in the matrix, the instantaneous fatigue, disturb and imprint status of the matrix or sub-units of the same, possible relevant environmental parameters (temperature), etc.

One overriding factor governing the controller function is that data shall not be lost. During a certain time in each refresh/restore operation there may be data in temporary storage in the device pending write-back. In certain circumstances these data would be lost if the refresh/restore operation is interrupted and terminated prematurely. Thus, although an incoming write/erase/read command may be defined as having higher priority than scheduled refresh/restore operations, instances may be encountered where the latter must be allowed to run their course to completion. On the other hand, if a prioritized memory access is incoming, ongoing refresh/restore procedures can be arrested at the nearest point in the cycle where this does not compromise data content and then remain in abeyance until the memory access is completed. An example of this would be, e.g. temporary interruption during global refresh of a complete matrix, where the matrix is subjected to the refresh procedure with a write-back step included, word line by word line in a stepped sequence. In this case, the refresh/restore process could be temporarily postponed between one word line refresh/restore and the next. If a large number of interrupting prioritized memory accesses occur before the refresh/restore process can be brought to completion, this contingency may be handled by an appropriately programmed controller. Referring back to step 1, a refresh operation may be initiated in periodic intervals such that e.g. a refresh procedure is allowed to start $t_{refresh}$ seconds after the targeted cells was refreshed last time. If the time $t_{refresh}$ is selected such that when it is reached, data still can be read and written in a controlled and reliable manner, it shall be possible to halt the initiated refresh procedure for yet another limited period of time to allow other higher prioritized activities to intervene and access the memory. However, there will always be a certain time limit when read and write may not longer be allowed until the refresh procedure has completed. At any time after this time limit, $t_{force}$ and before the refresh procedures has been completed, the refresh procedure must be forced with highest priority. By selecting an appropriate value of $t_{refresh} < t_{force}$ for a certain memory application, the refresh procedure may be transparent for normal memory accesses in most cases, compared to a situation with a refresh procedure that always require highest priority. Clearly, there is a trade-off between achieving smooth, fast and transparent access to the data content in the memory device on the one hand, and avoiding complex and heavy processing and memory functions in the controller on the other hand. In applications where incidences of delayed memory access are unproblematic, a simple solution is to let normal accesses get no priority during the refresh/restore.

Figure 4:
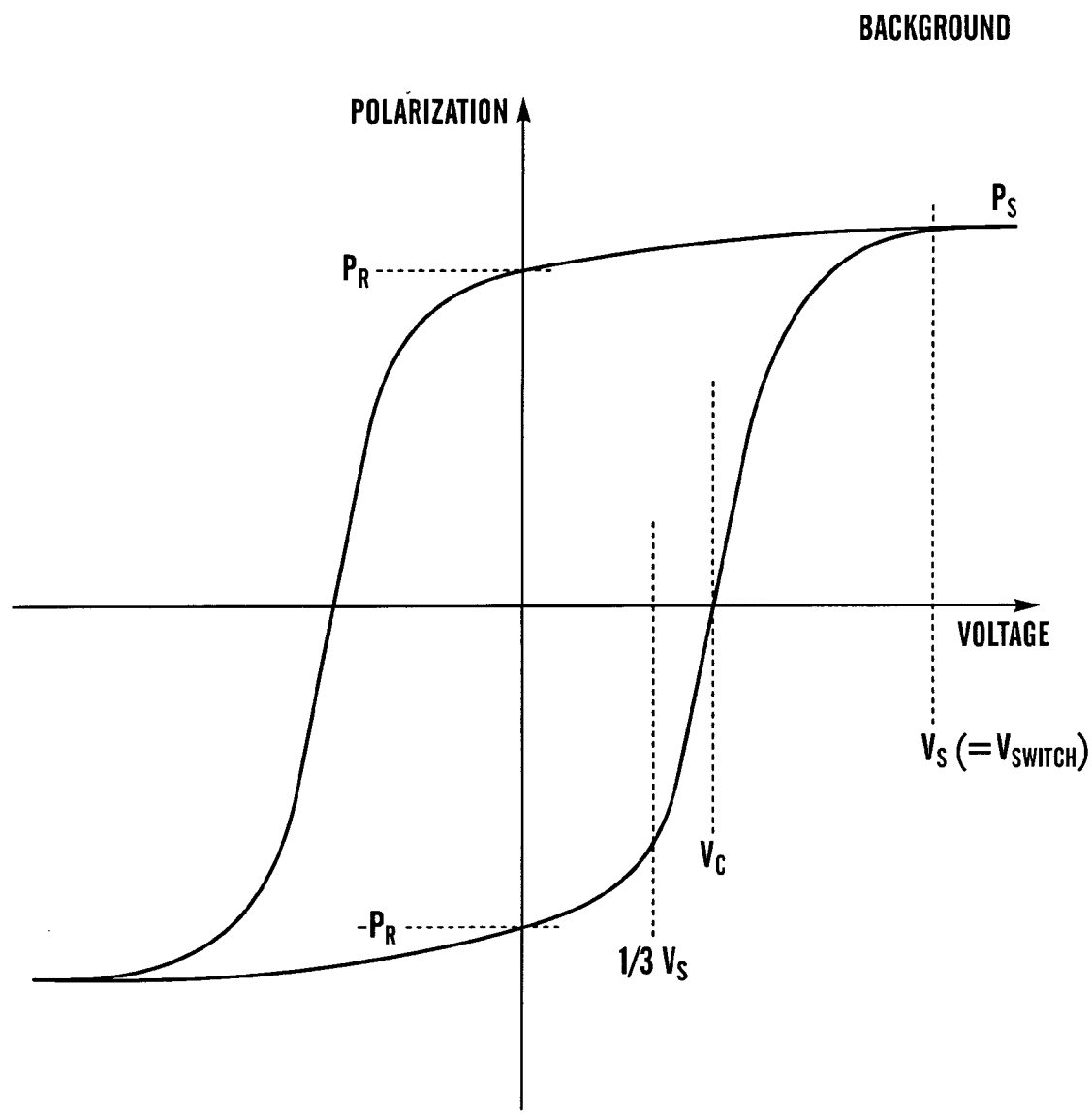
Figure 6:
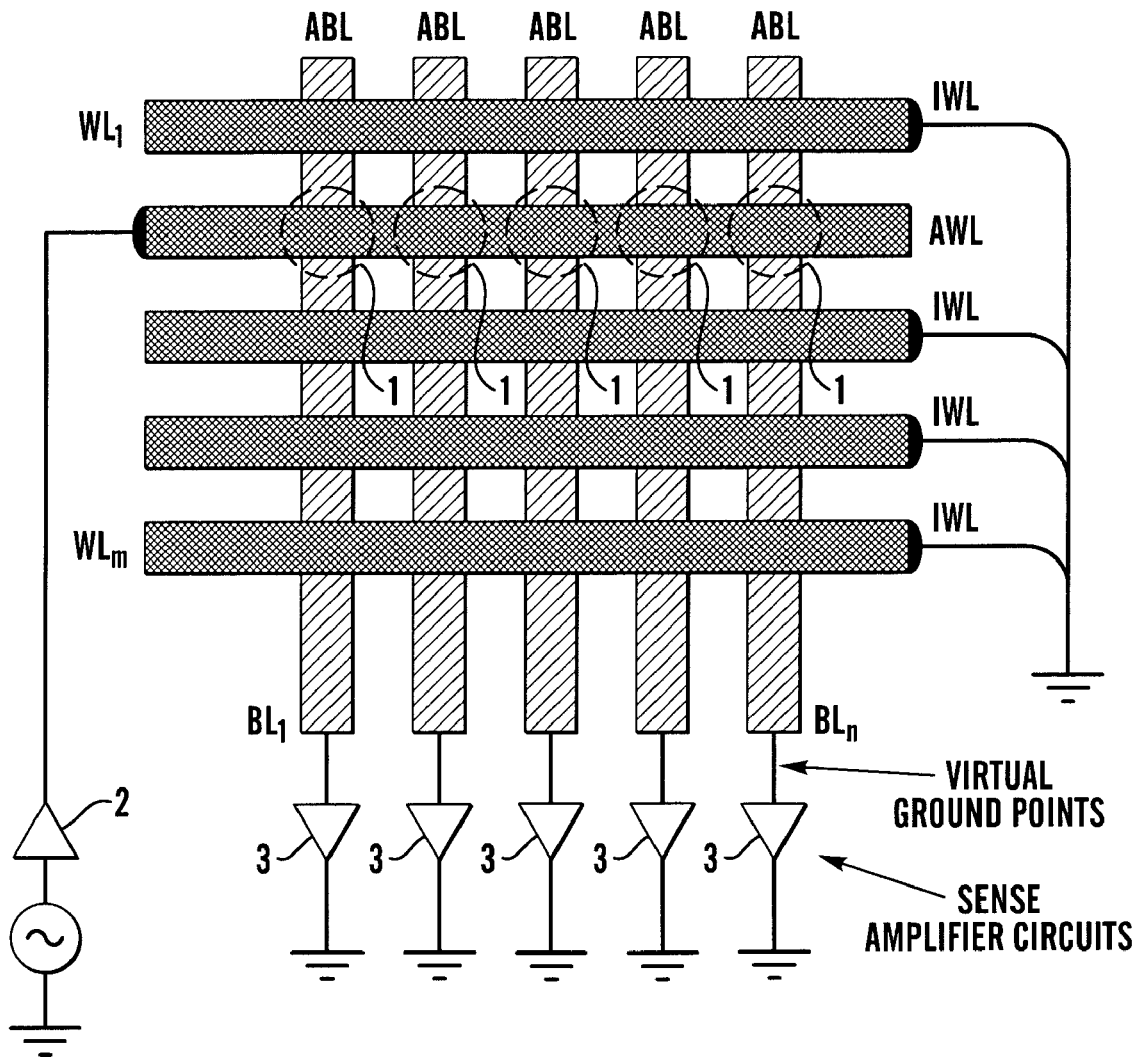

The third step in the refresh procedure shall now be discussed: As shown in one example one embodiment in FIG. 6, all cells on a selected word line ("active word line", AWL in the figure) are subjected to a voltage pulse of predefined polarity and sufficient strength to switch those cells that are polarized opposite to the direction of the field set up by the voltage pulse. This is achieved by means of a signal source and amplifier connected to the selected word line as shown. At the same time, all other word lines (inactive word lines, IWL in the figure) and all bit lines (active bit lines, ABL in the figure) are kept at a potential ensuring that voltages across all other cells than those on the selected word line are zero or nearly zero (the bit line potentials are actively held at virtual ground by means of the sense amplifier circuits shown symbolically in the figure). In this way, no disturbing voltages appear across non-addressed cells, i.e. cells not connected to the AWL, anywhere else in the matrix. If this third step is performed as part of a read operation, switching currents resulting from the application of the voltage pulse are recorded in parallel by means of a sense amplifier connected to each bit line, and the corresponding logic states of the switched cells on the selected word line are determined. This procedure is reminiscent of "full row read" in the prior art, where it is employed to provide disturb-free, highly parallel read-out from passive matrix addressed memory arrays. In the present case, however, where particular attention is paid to the possibility that the cells may be heavily imprinted prior to the operation, there is specified that the voltage pulse applied to the cells on the active word line can be selected to have a magnitude and/or duration which exceeds by a considerable margin that which is required to achieve transitions between the remanent polarization states $+P_r$ and $-P_r$ in an un-imprinted cell, indicated by the switching voltage Vs shown in FIG. 4. If this third step is performed as a part of a refresh or pre-set operation only, switching currents still need to be recorded and the data temporarily stored pending write-back if the cells that are to be refreshed or pre-set contain information that otherwise would be lost. If there is no need to save any stored data, the bit lines can be clamped to true ground by switches instead of being held at virtual ground as shown in FIG. 6. As is readily appreciated by a person skilled in the art, the precise choice of potentials as shown in FIG. 6 are for illustrative reasons only. Equivalent read schemes can be devised where potentials are uniformly shifted or exchanged compared with those shown in FIG. 6, e.g. placing the word line potential on ground and all other lines at a potential differing from the ground by a voltage corresponding to the switching voltage.

To conclude, this third step performs unlocking of cells imprinted opposite to the direction of the applied pulse in this step and polarizes them in one direction. This may be carried out in response to a read command or in other cases where it is desirable to polarize all addressed cells in the same direction, or as an initial step in the unlocking of heavily imprinted cells. Together with the subsequent steps, this step conditions the cells electrically to exhibit low imprint within a certain time-span following these operations.

The fourth step in the refresh procedure shall now be discussed: A series of pulses are applied to the selected word line according to a predefined protocol, where the number, strength, duration and polarities of individual pulses in the pulse train are selected so as to reduce or remove imprint in the cells and facilitate subsequent write/read operations. At the same time, the potentials on all other word lines and all bit lines are controlled such that voltages across all other cells than those on the selected word line are either nearly zero, or at least below the switching threshold, similarly to the case described under the third step above.

Figure 1:
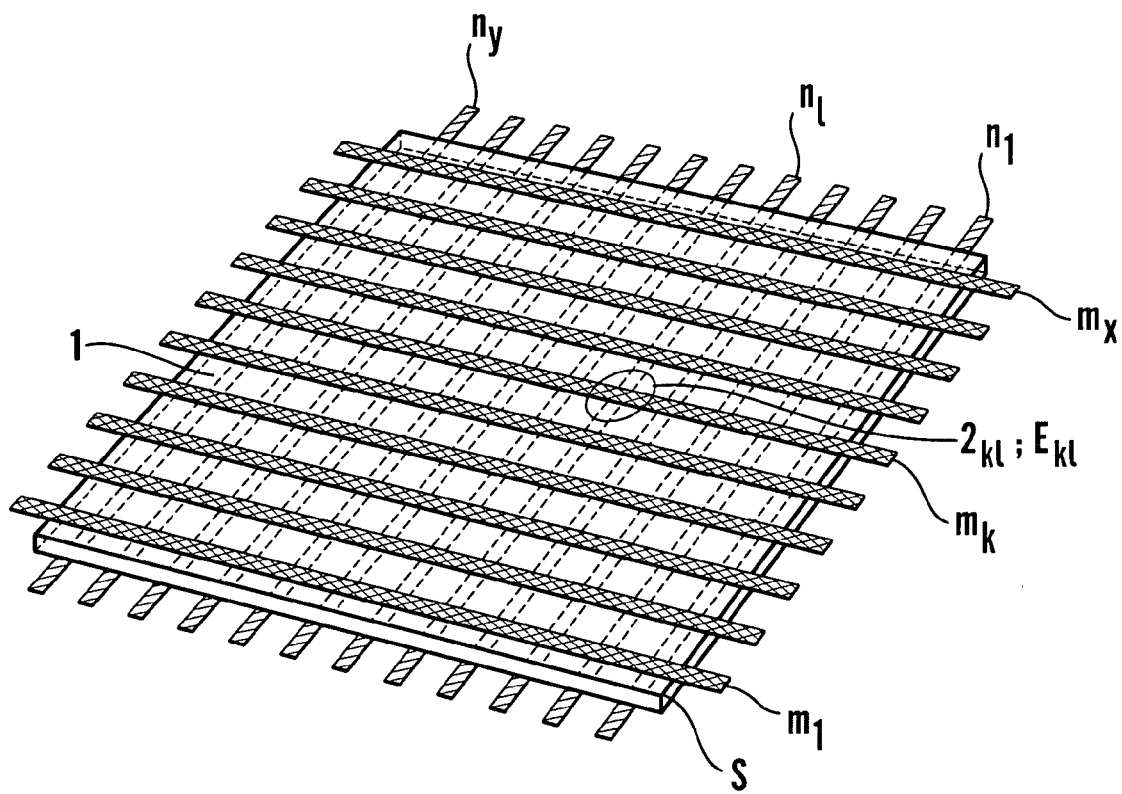
FIG. 1 shows as mentioned above a basic passive matrix arrangement as described in some detail above, with horizontal word lines crossing vertical bit lines, the cells being located in the overlap volumes where the word- and bit lines cross each other, FIG. 2, as mentioned above a cross section of one of the cells belonging to the matrix in FIG. 1, FIG. 3, as mentioned above the electrical selection of a given cell in a passive matrix being achieved by controlling the potentials on one word line (Active Word Line; AWL) and one bit line (Active Bit Line; ABL) crossing each other at the selected cell, FIG. 4, as mentioned above, a generalized hysteresis curve for an electret or ferroelectric filled capacitor in the absence of imprint phenomena. Important features are indicated, including the coercive voltage $V_c$ and the remanent polarization $P_r$, FIGS. 5a)–f), generalized hysteresis curves for an electret or ferroelectric filled capacitor, at different stages of imprint associated with remanent polarization in the + and − directions, FIG. 6 a passive matrix memory where all cells in a full row on a word line are being read out simultaneously, FIGS. 7a) and b) examples of a voltage pulse protocols effecting a read/refresh/write sequence, FIGS. 8a) and b) an example of voltage pulse sequences as used in the present invention, FIG. 9a an example of the application of a pulse protocol of passive matrix memory using a one-third voltage selection rule as known in the art and used in the present invention, FIG. 9b an example of the application of a pulse protocol to a matrix memory with no disturb on unaddressed cells, FIG. 10 an example of an embodiment of the invention applied to a segmented matrix memory and using word line mapping, FIG. 11 an embodiment of the present invention applicable to a matrix memory wherein most of the memory is not accessed for a long period of time, and FIG. 12 an embodiment of the present invention and suitable for refresh of heavily imprinted memory cells.
Figure 2:
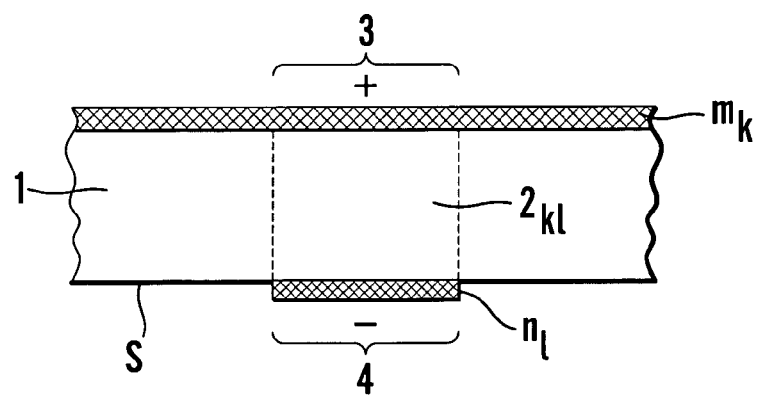
Figure 3:
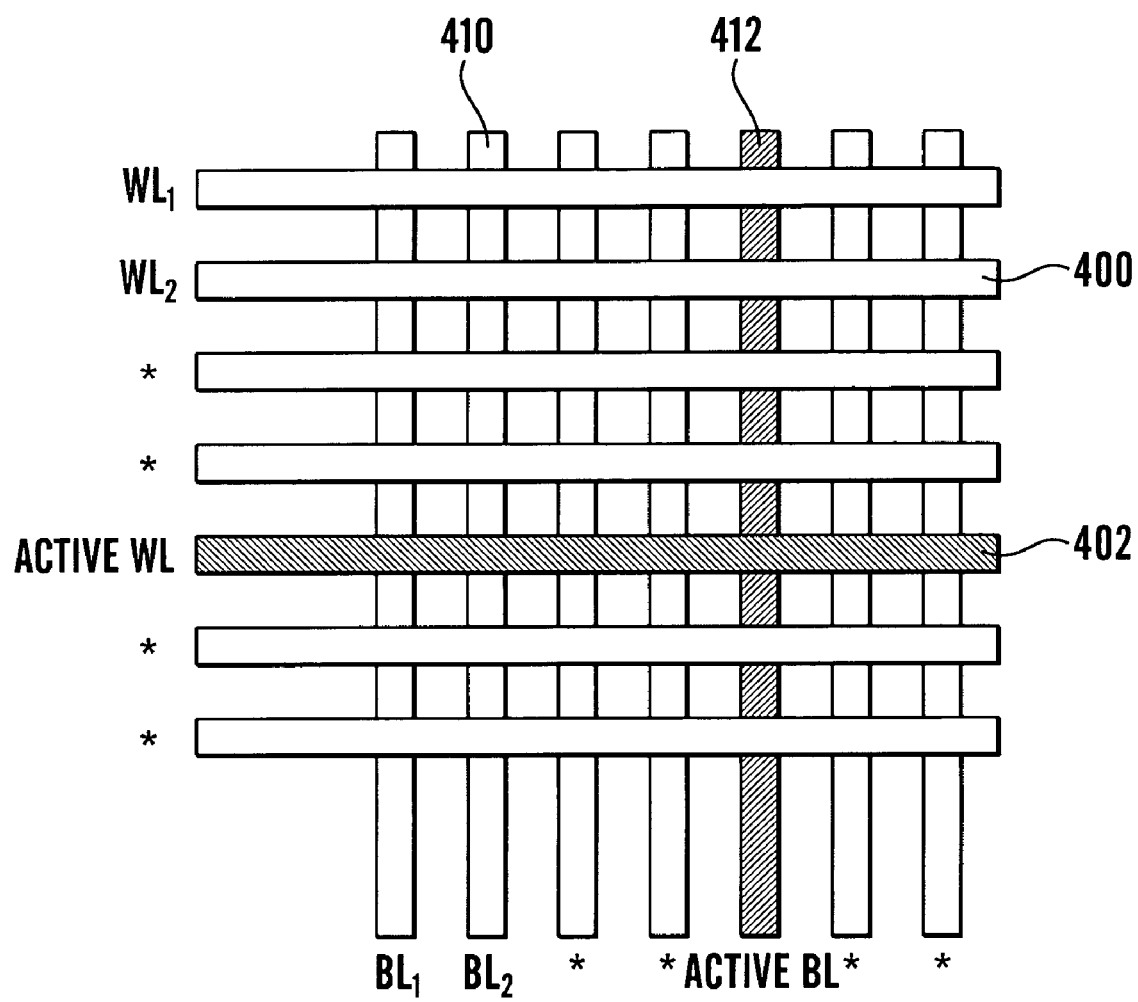

Imprint phenomena are complex and diverse, but there exists a considerable amount of empirical knowledge regarding the effects of electrical fields on imprinted electrets or ferroelectrics. Of particular relevance in the present context are voltage pulse sequences that can be applied to reduce or remove imprint from memory cells like those shown in FIGS. 1 and 2. Before proceeding, it may be useful to refer to FIG. 5e, which shows the situation for a single cell at a certain moment in time after it has been switched from an imprinted state of a given polarization to a new state with the opposite polarization: For a certain time, depending on how quickly imprint develops, the cell shall be apparently imprint-free in response to further applied electrical pulses.

Figure 8A:
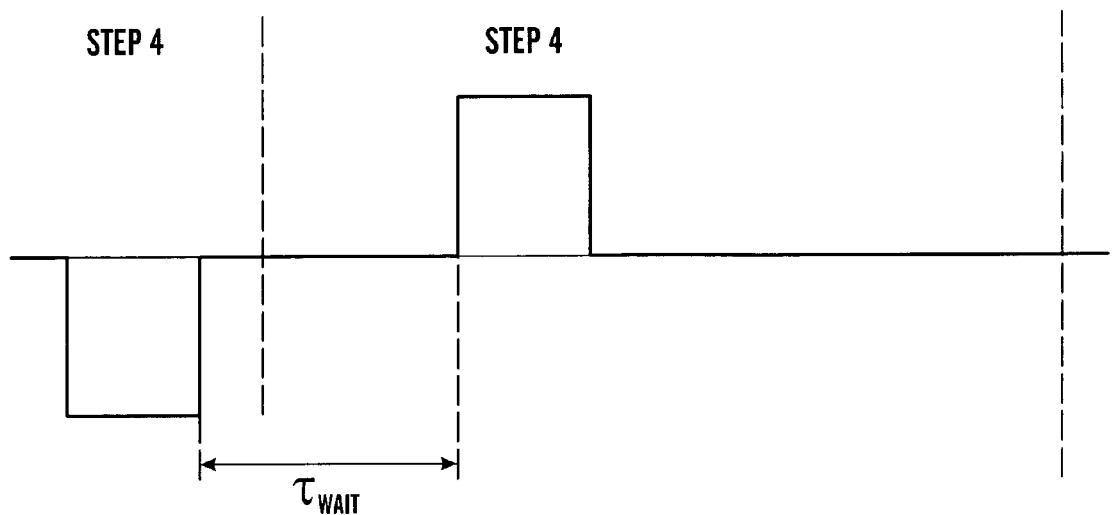
Figure 8B:
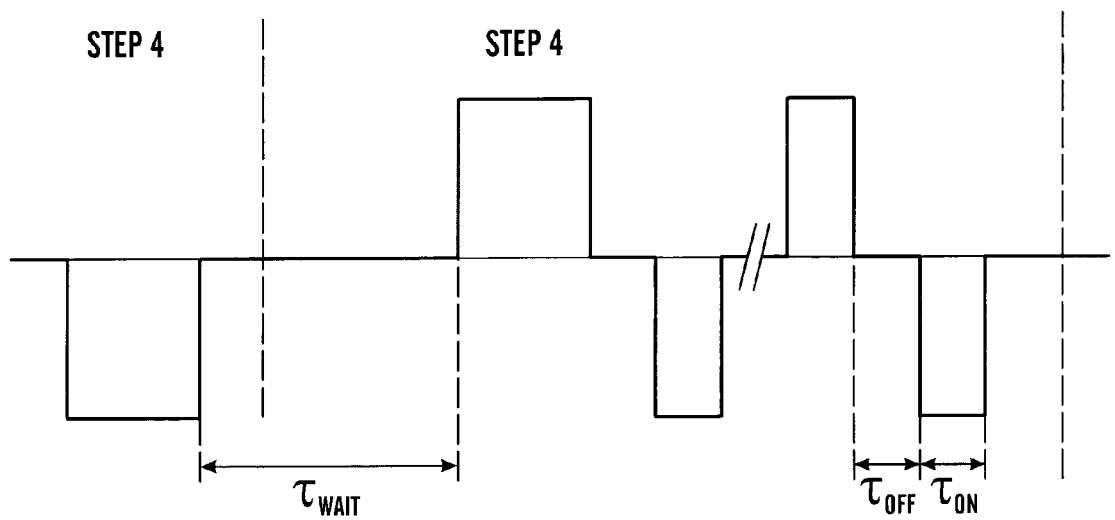

When imprint is to be removed from many cells simultaneously, as is the case where a full row of cells on a word-line are conditioned in parallel, it must be taken into account that cells may be imprinted in different directions, and a single unipolar pulse shall be inadequate. Empirically, it has been found that a sequence of bipolar pulses can be effective in removing imprint, regardless of initial imprint direction. An example of such a bipolar pulse sequence is shown schematically in FIG. 7. Here, only voltages appearing across cells on an addressed word line are shown: Following the unipolar pulse in Step 3 ("Refresh/Read"), there follows a train of bipolar pulses in Step 4 ("Refresh"), typically ending with a final pulse of a predefined polarity which sets the stage for a subsequent writing step. The number of pulses in Step 4 may range from a single one and up to many thousands, typically several hundreds are required. In situations where a high switching voltage is not desired or possible to obtain, the same switching effect can be obtained by pulses of less magnitude but longer duration. Generally, each of the pulses in Step 4 shall be of sufficient magnitude and duration to switch the polarization back and forth between $+P_r$ and $-P_r$, although this need not always be the case:

More complex pulse sequences may also be relevant, including sequences where strong switching pulses are combined with weaker pulses. Some further examples of pulse sequences are shown in FIG. 8. In FIG. 8a, Step 4 consists of a single pulse of polarity opposite to that in Step 3, and of sufficient magnitude and duration to ensure that cells imprinted in the direction of Step 3 (which would remain unperturbed by the pulse in Step 3) are unlocked and switched. Thus, the bipolar pulse set formed by Step 3 and Step 4 shall unlock cells imprinted in either direction. The timing is important, however: If the pulse in Step 4 follows very shortly after the pulse in Step 3, and the cell in question had been switched from an imprinted state by the pulse in Step 3, the de-imprinting effect of the pulse in Step 3 inherent in the gradual shift in the hysteresis curve has not yet had time to evolve, and the pulse in Step 2 shall switch the cell back to an imprinted state. Thus, a certain waiting time $\tau_{wait}$ shall typically be prescribed between the two pulses, where $\tau_{wait}$ must be sufficiently long to allow a certain measure of polarization stabilization in the cell, but not so long as to slow down the operation of the device. FIG. 8b shows a variant of the sequence in FIG. 8a, where now there is also included a train of bipolar switching pulses. In this example, the last pulse has a predefined polarity corresponding to that employed for pre-setting cells. The train of bipolar pulses must be selected according to the materials and operative conditions of relevance. This applies also to the interpulse spacing $\tau_{off}$ and pulse width $T_{on}$.

In FIGS. 7 and 8 are shown the voltages appearing across addressed cells only, and not those across non-addressed cells. The latter shall depend on the choice of pulse protocol for the whole matrix. In FIGS. 9a and 9b are shown examples of voltages applied to the word- and bit-lines according to two different protocols: In FIG. 9a non-addressed cells are exposed to Vs/3 disturb pulses. In FIG. 9b non-addressed cells are not exposed to disturb pulses, even in cases where strong pulses are applied to the addressed cells. Which scheme that shall be selected in each given case depends on disturb properties of the cells in question as well as performance and cost specifications for the device in question.

The optional writing step shall now be described. It provides for writing data into the cells that have been conditioned through the refresh procedure, or pre-setting cells to a specific polarization state pending later operations. In FIG. 7a the sequence includes a final writing step leaving the cell in a logic state 0 (e.g. corresponding to a $+P_r$ polarization state), whereas in FIG. 7b a corresponding pulse sequence for writing a logic 1 (e.g. corresponding to a $-P_r$ polarization state) is shown. In the latter case, a negative-polarity writing pulse in the writing step is indicated by stippled line, since the final pulse in Step 4 as shown here is negative and shall polarize the cell in the desired logic state 1, where the cell shall remain during the writing step. One notes that writing shall always lead to disturb voltages on non-addressed cells and hence a benefit accrues from the writing characteristics of the addressed cells being uniform and imprint-free. Thus, standard Vs/3 writing protocols can be used without the need for over-voltage or extra wide writing pulses, which could otherwise cause excessive disturb in non-addressed cells. Pre-setting or blanking of cells may in principle be performed in a disturb-free manner by directly polarizing one or more full word-lines at a time. Still, it may in certain instances be desirable to pre-set some, but not all, cells on a given word line. In those cases it may be a preferred default procedure to run through the full three-step procedure according to the present invention, since this minimizes disturb and guarantees that any imprint in the pre-set cells shall be limited to that which has evolved since the pre-setting operation only. This imprint shall be uniform in magnitude and direction amongst the pre-set cells.

According to the present invention, writing shall take place after the refresh procedure is finished and before any significant imprint has re-established itself in the cells. Typically, this is performed immediately, e.g. as part of a single pulse sequence as shown in FIG. 7. In other instances, imprint development may be sufficiently slow to allow other operations, idle periods or shut-down periods in the memory device to intervene before subsequent writing or pre-setting of the conditioned cells.

Within the scope of the present invention, the described refresh procedure can be elaborated and extended to achieve several specific objectives. Specific examples shall be given below as part of certain preferred embodiments.

Descriptions shall now be given of certain preferred embodiments.

In a preferred embodiment, data are read that are stored in cells that may be strongly imprinted, particularly in a boot-up situation, followed by refreshing the same cells:

In this case steps 1) through 4) are invoked. Since a strong read-out pulse can be used in the third step without causing any disturb elsewhere in the matrix, reliable read-out is achieved regardless of the initial imprint state of the individual cells on the selected word line. Furthermore, the fourth step ensures that remaining pre-read imprint or new imprint provoked by the strong read-out pulse in the third step is removed from all cells on the addressed word line.

In a second preferred embodiment, one avoids flip-back of polarization in imprinted cell that has just been written, either spontaneously due to heavy imprint or provoked by disturbs from cells elsewhere in the same matrix being subjected to switching pulses, e.g. in connection with writing or refresh.

In this case all steps including the writing step are invoked. Since the cells that are to be written to have been rendered uniform and essentially imprint-free during the refresh steps preceding to the writing step, the freshly written cells are no longer strongly biased by imprint that can cause flip-back. Non-addressed cells in the matrix shall generally be subjected to a minimum disturb stress compatible with the chosen write protocol (e.g.: Vs/3).

In a first class of preferred embodiments, one avoids gradual polarization erosion and possible loss of data in cells due to disturbs from cells elsewhere in the same matrix being subjected to switching pulses, e.g. in connection with writing or refresh operations: Referred to a given single cell representative of a word line or a block of word lines, the criterion for selection under the first refresh step is that the number of disturb events experienced by the cell since it was last written or refreshed exceeds a certain number. Following refresh, a write-back step is included, performed by either:

Data may be written back to their original physical location in the matrix. In certain cases, it may be desirable to employ encoding with logic ones and zeros being assigned with polarities opposite to those written in that location before refresh. Whereas this shall entail a certain amount of internal book-keeping in the memory device, it can allow steps 3 and 4 to be modified or simplified for speed advantage.

Alternatively, write-back occurs in other physical locations in the matrix that have been cleared and refreshed. In this case, the memory device controller must keep track of the time elapsed since last refresh in the relevant locations.

Figure 10:
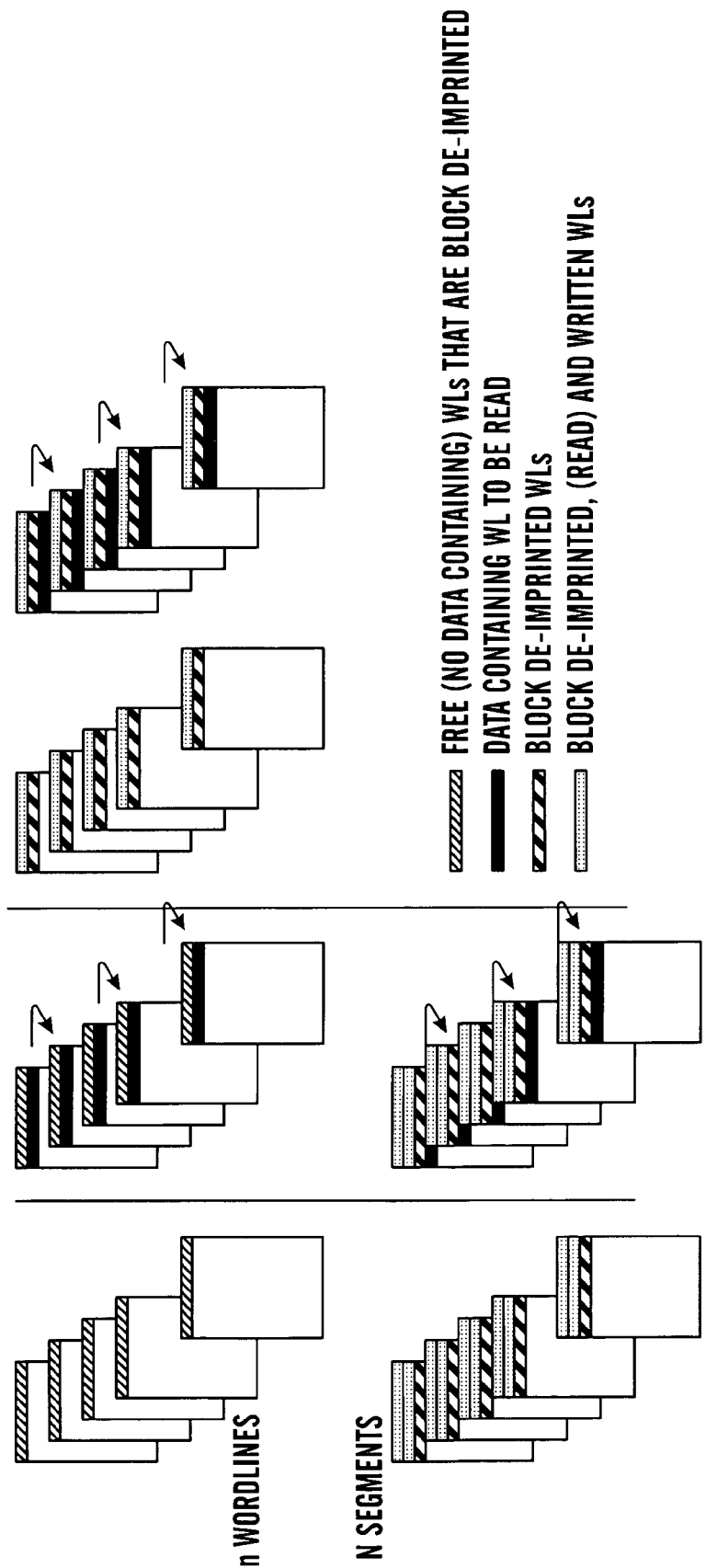

In a second class of preferred embodiments, illustrated in FIG. 10, a segmented memory (N segments) is configured in a way that there are, at any instant in time, n word lines per segment that are not carrying data. At a regular time interval $t_{refresh}$ (determined by imprint rate and the disturb properties of the particular memory film) a refresh operation is initiated on those word lines. The de-imprint operation consists of $N_{pulses,1}$ (e.g. 500) bipolar pulses over the full word line typically $\tau_1$ (e.g. 10 us) duration, $\tau_2$ (e.g. 10 us) pause time and with a voltage high enough for the cell to be switched completely in the available pulse duration. All UAWL-UABL pairs are kept at a zero voltage to avoid disturb using a special timing diagram. Immediately after the refresh procedure data are read from first word line of segment 1 and written into the first word line of the recently refreshed n word lines of segment 2. Immediately following this operation data from the first word line of segment 3 is written into the first word line of the n recently refreshed word lines of segment 4. The process is continued until data from all n word lines has been transferred to the n refreshed word lines of another segment. Once this is done the recently read n word lines of all segments are refreshed in the way described above. New data of n new word lines of N segments are then transferred to the recently refreshed word lines etc until all word lines of all segments have been refreshed.

The same method can be used to refresh a memory that has been at rest (power down) for a period longer than the t refresh. In that case, however, more cycles will be applied. It might also be necessary to prolong the pulse length and/or increase the voltage in order to still have a complete switch.

One major advantage of this implementation is that the total time spent on refresh can be kept low even if a large number of switches are needed for the removing imprint.

Another major advantage is that the method can handle unexpected power failures without loss of data, which would be the case if large amounts of data were stored in a buffer memory.

Figure 11:
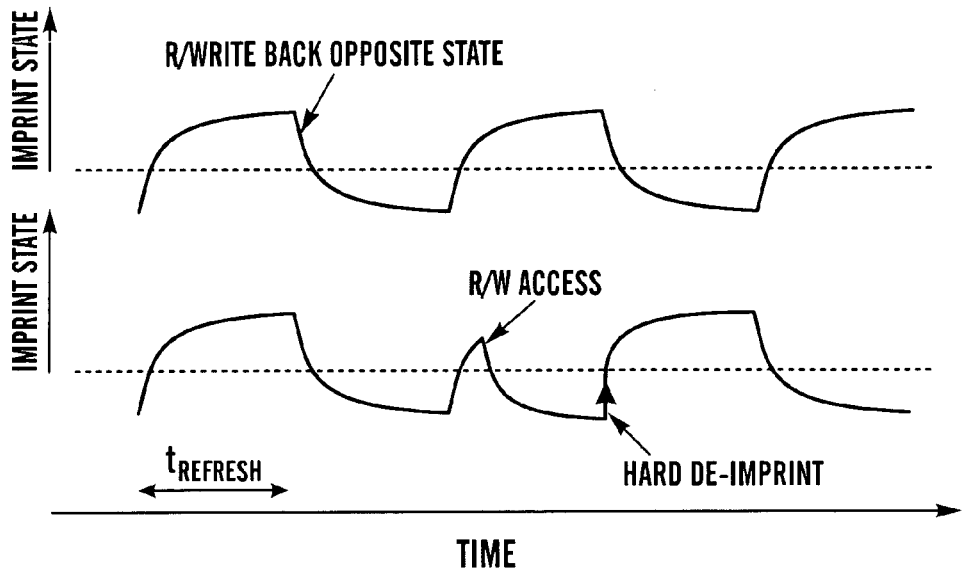

In a third preferred embodiment, illustrated in FIG. 11, suitable for applications of the memory where most of the memory is not accessed for long periods of time, information about the access status of all word lines is stored in a register. At a regular time interval $t_{refresh}$ a refresh operation is initiated targeting all word lines or a group of word lines utilizing an addressing scheme that is compliant with the concept of word line mapping. (Wordline mapping is described in Norwegian patent application no. NO20035225, filed by the present applicant). Two different refresh methods are applied. The interval $t_{refresh}$ shall be selected such that when reaching $t_{refresh}$, imprint shall only have evolved to a certain known limit for cells that have not been accessed during the interval, i.e. $t_{refresh}$ must be selected with respect to imprint rate and the disturb properties of the particular memory film. One method, hereafter referred to as hard refresh consists of a read of the full word line and storage of the information in a buffer memory or in another segment that recently has been refreshed, followed by $N_{pulses,2}$ (e.g. 500) bipolar pulses over the full word line and of duration $\tau_2$ (e.g. 10 us), pause time $\tau_4$ (e.g. 10 us) and with a voltage high enough for the cell to be switched completely in the available pulse duration. All UAWL-UABL pairs are kept at a zero voltage to avoid disturb. If the data originally stored in that word line were stored in a buffer, the same data are written back. The other method, referred to as imprint reversal, consists of a read followed by a write back in a direction opposite to the previous direction (inversion of data bits).

For word lines that are not accessed during the last $t_{refresh}$ interval imprint reversal is applied. For word lines that have been accessed during the last $t_{refresh}$ interval a hard refresh is applied.

One major advantage of this embodiment is that the total time spent on refresh can be kept low even if a large number of switches are needed for the hard refresh.

In a fourth preferred embodiment the requested content of a memory that have been at rest for a time longer than t refresh (e.g. in a boot-up situation) is read word line by word line (keeping all unaddressed word lines at zero or close to zero voltage with respect to the bitlines) using a pulse duration long enough to be able to perform a full switch of the cells (95% of polarization obtained). Data is then written back in a direction opposite to the previous direction (inversion of data bits). After all the requested data is read out and rewritten into the memory a hard refresh is performed on the full memory. The hard refresh consists of a read of the full word line and storage of the information in a buffer memory or in another segment that recently has been refreshed, followed by $N_{pulses,2}$ (e.g. 500) bipolar pulses over the full word line and of duration $\tau_3$ (e.g. 10 us), pause time $\tau_4$ (e.g. 10 us) and with a voltage high enough for the cell to be switched completely in the available pulse duration. All UAWL-UABL pairs are kept at a zero voltage to avoid disturb. If the data originally stored in that word line were stored in a buffer, the same data are written back.

Figure 12:
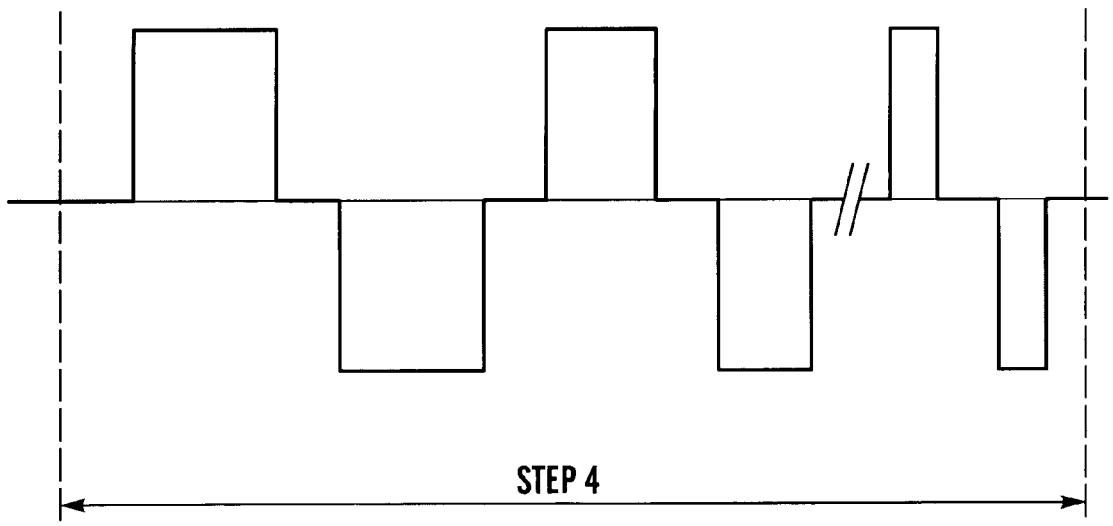

The advantage of using this method is that reading the memory can take place at a speed much higher than if it has to be a combined read/refresh for every word line or block of word lines. Another advantage is that the memory cells that are read and re-written are self de-imprinted during the time from read is finished to the hard refresh is started due to the polarization reversal In a fifth embodiment, illustrated in FIG. 12, the fourth step contains a large number of bipolar switching pulses in order to achieve efficient refresh. In certain cases with heavily imprinted cells it has been found that several hundred and up to thousands of pulses are required, which consumes much time. During this polarization cycling, it is typically hardest to achieve polarization switching at the beginning of the step 4 pulsing sequence, since the imprint effect is gradually reduced as the number of switches that has been carried out becomes larger. Accordingly, this preferred embodiment provides for starting out the step 4 pulse sequence with one or more wide pulses, capable of switching even heavily imprinted cells, and stepwise or gradually reducing the pulse width while still switching the cells, as shown schematically in FIG. 12. With many pulses involved, this shall reduce the overall time consumed by step 4.

The invention claimed is:

1. A method for operating a passive-matrix addressable ferroelectric or electret memory device wherein said memory device comprises:

one or more arrays or matrices with memory cells in the form of a ferroelectric or electret thin-film polarizable material exhibiting hysteresis, particularly a ferroelectric or electret polymer thin film, and a first and second set of respective parallel electrodes, wherein the electrodes of the first set forming word lines in the device, are provided in substantially orthogonal relationship to the electrodes of the second set forming bit lines in the device, wherein the electrodes of said first and second set are provided in direct or indirect contact with the thin-film material of the memory cells, whereby a polarization state in individual memory cells can be read, erased or written by applying appropriate voltages to the individual electrodes of respectively said first and second set of electrodes, wherein the method implements a voltage pulse protocol based on a one-third voltage selection rule whereby non-addressed cells are subjected to disturbing voltages across them not exceeding approximately ⅓ of the switching voltage Vs, wherein the voltage pulse protocol comprises a read cycle and a write/erase cycle respectively with time sequences of voltage pulses of predefined amplitudes, polarities and lengths, wherein the read cycle comprises applying a set of voltage differences to electrodes of respectively said first and second set of electrodes in case data are read out from the memory cells, and wherein the write/erase cycle comprises steps for applying another set of voltage differences to electrodes of respectively said first and second set of electrodes, and wherein the method includes a refresh procedure with the following steps, a) a first step for selecting according to criteria programmed in a memory device controller, one or more cells for refresh and entering the one or more cells thus selected, in a refresh request processed in the controller, b) a second step for monitoring and processing the refresh requests, taking into account ongoing or scheduled memory operations and the priorities assigned thereto, and initiating the refresh procedure, c) a third step for applying simultaneously to the one or more cells selected for refresh a voltage pulse of a defined polarity and a magnitude corresponding to the coercive voltage or higher, while all non-selected memory cells are subjected to zero voltage or a voltage significantly less than the coercive voltage, and d) a fourth step for applying simultaneously to all selected cells a single voltage pulse or a train of voltage pulses, at least one of the voltage pulses having a polarity opposite the defined polarity in step c) and with a magnitude corresponding to the coercive voltage or higher, while all non-selected cells are subjected to zero voltage or a voltage significantly less than the coercive voltage.

2. A method according to claim 1, further comprising a step for performing a write operation as given by the write cycle of the voltage pulse protocol on the one or more cells selected for refresh.

3. A method according to claim 1 wherein more than one cell is selected in step a), wherein the selected cells correspond to a full row in the memory device.

4. A method according to claim 1 wherein more than one cell is selected in step a), wherein the selected cells correspond to a block of cells in two or more rows in the memory device.

5. A method according to claim 1 wherein step d) encompasses two or more pulses, and employs pulses of equal or different time profiles, where the amplitudes, pulse lengths and interpulse delays are selected according to a predefined protocol.

6. A method according to claim 1 further including the step of generating said voltage pulses in step c) by applying a predefined potential to one selected word line and simultaneously applying a different but mutually essentially equal potential to all other word lines and all bit lines belonging to the same passive matrix or segment of same.

7. A method according to claim 1, further including the step of generating said voltage pulses in step d) by applying a series of time dependent potential levels to all word- and bit lines belonging to the same passive matrix or segment of same in such a manner that potentials on all lines except one selected word line or a set of selected word lines are mutually essentially equal.

8. A method according to claim 1, further including the step of extracting stored data from selected cells on at least one word line in step c), storing the extracted data temporarily elsewhere in the memory device, followed by writing back the same data to said at least one word line during a subsequent further writing step.

9. A method according to claim 8, further including the step of writing back each bit to the same physical location it had before said first read or erase step, but with polarization directions inverted.

10. A method according to claim 1 wherein step a) further includes selecting for refresh all cells in the memory device that are subjected to their first reading or writing operation after boot-up.

11. A method according to claim 1 wherein step a) further includes selecting for refresh all cells in the memory device that have been idle for a period exceeding a predefined time.

12. A method according to claim 10 or 11, wherein the selected cells constitute a block or segment of a matrix containing at least two word lines.

13. A method according to claim 1, further including defining pulse amplitudes and timing in steps c) and d) by an algorithm with input parameters derived from at least one environmental and/or usage history metric.

14. A method according to claim 13, further including selecting said environmental metric as the instant temperature or temperature history at one or more points near, on or in the memory device.

15. A method according to claim 13, further including selecting said usage history metric as the number of write and/or read events experienced by a single word line or a matrix segment since last application of said refresh pulse protocol.

16. A method according to claim 1, further including selecting for refresh in step a) all cells on a word-line where at least one cell exhibits polarization switching performance commensurate with one or more pre-defined criteria.

17. A method according to claim 1, further including selecting for refresh in step a) all cells belonging to a block or segment in the matrix where at least one cell on one word-line exhibits polarization switching performance commensurate with one or more pre-defined criteria.

18. A method according to claim 16 or 17, including in the said criteria the reduction of polarization switching speed below a predefined threshold.

19. A method according to claim 16 or 17, including in the said criteria the reduction of polarization switching charge below a predefined threshold.

20. A method according to claim 16 or 17, wherein said selected memory cells in the memory device are memory cells addressed during regular read, erase or write operations of the memory device.

21. A method according to claim 16 or 17, wherein said selected memory cells in the memory device are memory cells specifically allocated for reference or control purposes.

22. A method according to claim 1, wherein the priorities assigned in step b) are based on a predefined hierarchy of priorities involving electronic access to word- and bit-lines in each matrix segment.

23. A method according to claim 1, further including completing the steps c) and d), once started on a given word line or set of word lines and involving data read-out in step c), only when data that have been read out have been saved in the memory device or transmitted elsewhere according to the readout command.

24. A method according to claim 1, further including executing the refresh procedure by default during idling periods in the memory device or sub-unit thereto.

25. A method according to claim 1, further including implementing said refresh procedure according to a predefined program, to encompass predefined matrices or matrix blocks or—segments in the memory device.

26. A method according to claim 1, further selecting a bipolar pulse train during the fourth step, wherein the pulse width is diminished gradually or in steps as the pulsing progresses.

* * * * *